Dec. 24, 1968 HUNG CHANG LIN 3,418,492

LOGIC GATES

Filed Aug. 9, 1965 2 Sheets-Sheet 1

WITNESSES:
Bernard R. Gregory
Leon M. Garman

INVENTOR.
Hung Chang Lin
BY
Dean Schron
ATTORNEY

Dec. 24, 1968 HUNG CHANG LIN 3,418,492

LOGIC GATES

Filed Aug. 9, 1965 2 Sheets-Sheet 2

United States Patent Office 3,418,492

Patented Dec. 24, 1968

3,418,492

LOGIC GATES

Hung Chang Lin, Silver Spring, Md., assignor to Westinghouse Electric Corporation, Pittsburgh, Pa., a corporation of Pennsylvania Filed Aug. 9, 1965, Ser. No. 478,273
6 Claims. (Cl. 307—214)

This invention in general relates to semiconductor logic circuits, and in particular, to low-dissipation high-speed logic gates.

Logic gates for use in digital systems are designed for receiving one or more input signals from a previous stage or stages in order to provide output signals for driving one or more subsequent stages. The number of input signals received from previous stages is generally called the fan-in, and the number of subsequent stages to be driven is termed the fan-out. The gating circuits operate in an on-off mode representing binary ONE and binary ZERO information. The gates are connected to a source of operating potential through a load resistor and current will flow through the load resistor to drive the semiconductor elements of a subsequent stage or stages. In order to have high fan-out capabilities it is desired that the driving current available from the gate be relatively high. Speed of operation is an important consideration in the design of logic gates and faster propagation times may be achieved by operating the gates at increased current levels. For various combinations of input signals this current is not required and an unwanted power dissipation and power waste results.

In the field of micro-miniature and integrated circuitry wherein the semiconductor elements are formulated on a semiconductor wafer, the unwanted and excess power dissipation can cause excessive heating, tending to alter or destroy proper operation. By increasing the value of load resistor, a smaller current may be provided so that less of a power dissipation takes place. In logic gates which utilize transistors operating in a saturated and unsaturated mode there is a certain turn-off time which causes objectionable delays. This turn-off time is due to the charge storage of the transistor, the presence of the collector-base capacitance, and other stray capacitance due to the various circuit components, including the fan-out stages. These capacitances may be simulated by an equivalent capacitance at the output terminal of the logic gate. With an increased value of load resistor, for reducing power dissipation, the load resistance R in combination with the equivalent capacitance C at the output terminal constitutes a finite RC time constant which is relatively high due to the high load resistance so that the turn-off time and consequently the speed of operation of the gate suffers.

It is therefore a primary object of the present invention to provide an improved logic gate which operates at reduced power dissipation.

Another object is to provide logic gates which operate at very high switching speeds and at reduced power dissipation.

A further object is to provide logic gates wherein current flow is substantially eliminated when not needed, without sacrificing speed of operation.

It is a further object to provide logic gates which may be fabricated entirely as an integrated circuit.

Basically, in accordance with the above objects, the logic gates of the present invention include input means for receiving binary input signals and an output switching device operable in an on and off mode of operation for providing output signals in response to the input signals, the output depending upon the logic function implemented. An output terminal means is connected to the output switching device so as to deliver an output signal to a subsequent stage or stages. Another switching device is connected to the output terminal and is made responsive to a certain voltage change, for example from a high to a low voltage change but not vice versa, to turn on and supply a surge of current to the output terminal means only for a transient period in which the voltage level changes and not thereafter during steady state conditions.

A basic logic circuit, according to the teachings herein, is an inverter circuit utilizing as the switching devices, complementary first and second transistors with the first constituting an output transistor and the second transistor being responsive only to a voltage change as opposed to a voltage magnitude for turning on when the first turns off. This may be accomplished, for example, by capacitively coupling the second transistor to a circuit point where a change in voltage is exhibited due to changing input binary signals.

Other embodiments of the invention include gates which receive a plurality of input signals for turning an output transistor on and off, with each of these gates including other transistor means responsive to a certain voltage change at a particular circuit point for turning on only for a transient period during which the output transistor is turning off, and after which the other transistor means remains in an off condition.

The above stated as well as further objects, advantages and features of invention will become apparent upon a reading of the following detailed specification taken in conjunction with the drawings, in which.

Figure 1:
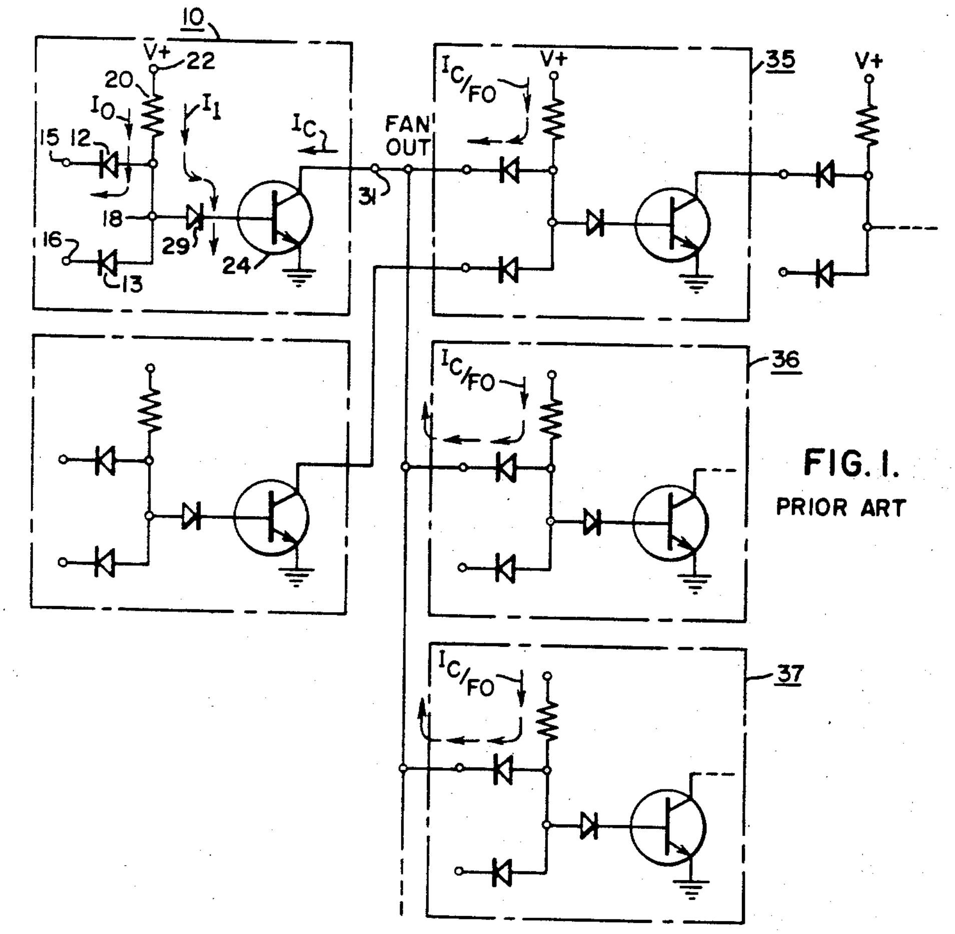
FIG. 1. PRIOR ART
FIGURE 1 illustrates a NAND logic system of the prior art.

FIG. 1 illustrates a typical prior art gating arrangement and by way of example NAND gates are illustrated. A NAND gate performs the logic function of providing a ONE output signal when any one of its input signals is ZERO, and providing a ZERO output signal only when all of its input signals are ONES. A typical NAND gate 10 includes a plurality of input diodes of which two, 12 and 13, are shown. Binary input signals are applied to input terminals 15 and 16 respectively connected to the cathodes of diodes 12 and 13, the anodes of which are connected to a circuit point 18. A load resistor 20 is connected to the circuit point 18 and to biasing terminal 22 to which is applied a source of operating potential $V_+$. An output transistor 24 is connected to the circuit point 18 through diode 29. Output terminal means 31 is connected to an electrode of the output transistor 24 and provides the input signals to subsequent stages 35, 36 and 37. If a ZERO signal appears at one of the input terminals, for example terminal 15, diode 12 conducts and the current $I_0$ flows through load resistor 20 through diode 12 back to a previous stage.

In the case of the NAND gate, the current $I_0$ causes an unwanted power dissipation.

The voltage appearing at the circuit point 18 due to a ZERO input signal is equal to the voltage drop across the diode and the $V_{CE(sat.)}$ (saturation collector-emitter voltage) of a previous stage, the voltage at circuit point 18 being in the order of 0.8 volt for silicon semiconductor devices. Due to the presence of diode 29, the 0.8 volt at circuit point 18 is insufficient to turn on the output transistor 24, the off condition thereof representing a ONE signal at the output terminal means 31.

When all the input signals to gate 10 are high (ONES) diodes 12 and 13 are blocked, the voltage at circuit point 18 rises and current $I_1$ will flow from $V_+$, through load resistor 20, through diode 29 and will be the base current of output transistor 24. Basically, the larger the base current, the larger the collector current, and therefore the greater fan-out capabilities. When base current flows, each of the subsequent gates 35, 36 and 37 provides a portion of the collector current of transistor 24, each portion being designated $I_C/F_O$ where $I_C$ represents the collector current of transistor 24 and $F_O$ represents the number of fan-outs. $I_C/F_O$ is equivalent to the $I_0$ of gate 10.

In analyzing the operation of the NAND gate 10, one may assume that there is an equivalent capacitance to ground connected to the output terminal means 31. This equivalent capacitance results from stray or line capacitance to ground, the presence of collector-base capacitance, and in some circuits (not FIG. 1) speed up capacitors used in subsequent stages. The analysis then reduces in essence, to a situation where the output transistor 24 drives a capacitive load and charges it up to a ONE voltage and dicharge it to a ZERO voltage in accordance with the input signals and the logic function performed.

A situation is presented therefore when for some applications a large current is desired ($I_1$) for increasing speed and fan-out capabilities, and for other applications a small current ($I_0$) is desired for reducing power dissipation. The present invention solves this problem by providing logic gates which operate at extremely high switching speeds and at greatly reduced power dissipation ratings, and to this end reference is now made to FIG. 2.

Figure 2:
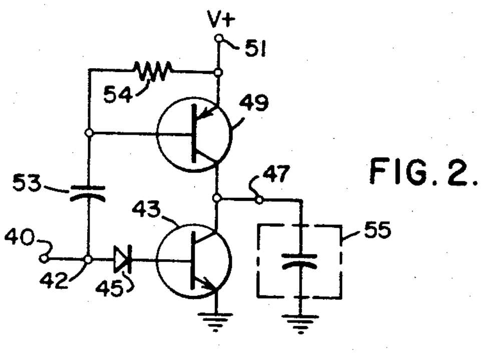
FIG. 2 illustrates an inverter gate according to the teachings of the present invention.

FIG. 2 illustrates an inverter logic gate according to the teachings of the present invention. The logic gate of FIG. 2 includes input means in the form of input terminal 40 for receiving binary input signals and connected to circuit point 42. An output switching device in the form of transistor 43 is provided and has its input electrode connected through diode 45 to the circuit point 42. Output terminal means 47 is connected to an electrode of transistor 43 for delivering output signals to subsequent stages when transistor 43 switches between its on and off mode of operation in response to input signals applied to input terminal 40.

Other transistor means in the form of transistor 49 has one electrode connected to the output terminal means 47 and another electrode connected to biasing terminal 51 to which is applied a source of operating potential $V_+$. Circuit means connects the input electrode of transistor 49 to the circuit point 42 for turning on transistor 49 only for a transient period when the voltage at point 42 changes from a first to a second predetermined level. Capacitor 53 in conjunction with resistor 54 serves this function, the combination acting as a differentiator, so that as the voltage at point 42 switches between low and high values, positive and negative spikes are presented to the input electrode of transistor 49, which will turn on only for the duration of a negative spike.

Transistor 43 is of one conductivity type, namely, an NPN transistor and transistor 49 is of an opposite conductivity type, a PNP transistor. Transistors 43 and 49 each have a like electrode, illustrated as a collector electrode, directly connected to one another with the output terminal means 47 being directly connected to these directly connected electrodes. A capacitor load 55 is connected to output terminal 47 and represents an equivalent capacitance as previously explained. The specific value of capacitance will, of course, depend upon various circuit components utilized and the number and nature of the subsequent fan-out stages.

In FIG. 2 and the subsequent figures it is assumed that positive logic will be utilized. The teachings of the present invention are equally applicable to negative logic by rearrangement of transistor types and by connecting various gates to sources of negative potential as is apparent to those skilled in the art.

The voltages appearing at the output lead means of the gates illustrated herein will, in general, depend upon circuit design considerations such as voltage supplies, resistors, types of transistors utilized and to a large extent, upon the subsequent circuitry receiving the output signals. The term binary signals is utilized herein to mean a ZERO signal, which is a low voltage near ground or approximately 0.2 volt above ground for silicon transistors, and a ONE signal which is a higher voltage ranging anywhere from approximately 0.6 volt to the supply voltage, the exact voltage being determined by the circuit parameters and arrangement. Basically, when the output transistor is in its off condition the output signal therefrom represents a ONE and when the transistor is in its on condition, the output signal therefrom represents a ZERO.

For purposes of explanation, assume that the input signal appearing at input terminal 40 of FIG. 2 is a high voltage ONE; transistor 43 will be in its on state, and the output signal appearing at the output terminal 47 will therefore be a low voltage ZERO in the order of approximately 0.2 volt (the $V_{CE(sat.)}$ of transistor 43). With transistor 43 in its on condition and a ONE signal being applied at input terminal 40, transistor 49 remains in an off condition since capacitor 53 blocks the steady state DC signal. Capacitor load 55 connected between output terminal 47 and a common circuit point illustrated as ground is charged up to the ZERO voltage of 0.2 volt. When output transistor 43 switches to its off state, it will provide a ONE output signal. The capacitor load 55 must charge up to this ONE voltage. The change of charge on capacitor load 55 is a function of its capacitance, the change in voltage across the capacitor, the value of driving current and the length of the time that the driving current is applied. Output transistor 43 will switch to its off condition upon the application of a ZERO signal to input terminal 40. The change of input signal from a previous high level ONE to a low level ZERO is coupled through capacitor 53 to the input electrode of transistor 49 which turns on and supplies a surge of current to the output terminal means 47 to charge the capacitor load 55 up to its ONE value, in FIG. 2, the ONE level being approximately $V_+$. Once the input signal has reached its steady state ZERO value, capacitor 53 again blocks this DC value and transistor 49 reverts to its off condition.

Transistor 49 will only turn on upon the application of a negative going signal at its input electrode so that when the input signal changes from a ZERO to a ONE, the change in voltage is positive going which, when coupled to transistor 49, tends to keep it in an off condition. Transistor means 49, therefore, only turns on for an instant of time during the period that output transistor 43 is turning off. This operation supplies a surge of current to the output terminal 47 to charge up the equivalent capacitor load 55 thus resulting in a much faster speed of operation. Not only is the speed of operation of the circuit of FIG. 2 greatly increased but the power dissipation is reduced to a negligible point since transistor 49 is only on for an instantaneous period of time and is off during the steady state period.

Figure 3:
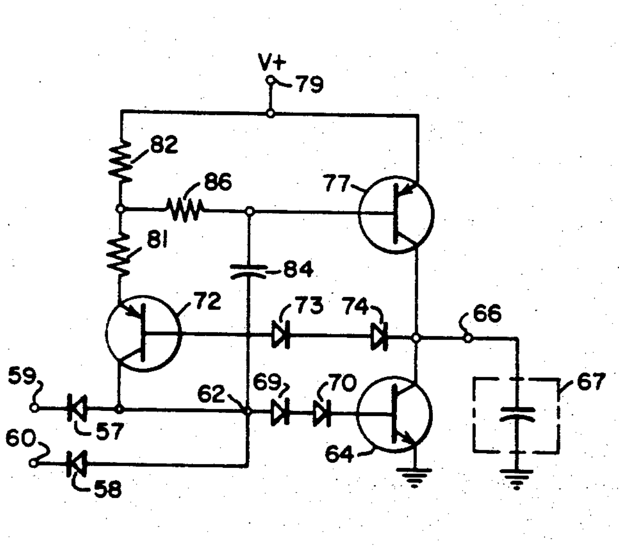
FIGS. 3 and 4 illustrate other logic gates according to the teachings of the present invention.

FIG. 3 illustrates another logic gate utilizing the principles of the present invention. With positive logic, the gate of FIG. 3 performs the NAND function. The input means for receiving binary input signals includes a pair of diodes 57 and 58 having their cathode electrodes connected to input terminals 59 and 60 respectively. The anode electrodes of diodes 57 and 58 are commonly connected to circuit point 62. Output transistor 64 is included and has output terminal means 66 connected to the collector electrode thereof with the emitter electrode thereof being connected to a common circuit point illustrated as ground. An equivalent capacitor load 67 is connected between the output terminal means 66 and ground. Circuit means in the form of diodes 69 and 70 connect the base electrode of output transistor 64 with the circuit point 62. Diodes 69 and 70 in conjunction with the base-emitter diode of output transistor 64 set the voltage level at circuit point 62 when the output transistor 64 is on.

In addition to the output transistor 64, the NAND gate of FIG. 3 includes a first transistor 72 having its base electrode connected through diodes 73 and 74, which balance the voltage drop across diodes 69 and 70, to the collector electrode of transistor 64. The collector electrode of transistor 72 is connected to circuit point 62 and it is seen that the PNP transistor 72 and the NPN transistor 64 are arranged such that the base current of transistor 72 is the collector current of transistor 64 and the collector current of transistor 72 is the base current of transistor 64. It may be mathematically demonstrated that these interconnected transistors will turn on as a PNPN switch if the common base forward current gain of transistor 72 and the common base forward current gain of transistor 64 is equal to or greater than ONE, that is $\alpha_{Q1}+\alpha_{Q2}\geq 1$ where Q1 represents transistor 72 and Q2 represents transistor 64. Oscillation in on and off mode of this PNPN switch may then be obtained with proper voltage at point 62. The portion of the logic gate thus far described is disclosed and claimed in copending application Ser. No. 390,788, filed Aug. 20, 1964 and assigned to the same assignee as the present invention. The circuit of FIG. 3 however operates at faster speeds by virtue of the inclusion of other transistor means in the form of PNP transistor 77 serially arranged with the NPN transistor 64 and having an electrode, its collector electrode, connected to the output terminal means 66. The emitter electrode of transistor 77 is connected to the biasing terminal 79, to which may be applied a proper source of operating potential $V_+$ The emitter of the first transistor 72 is similarly connected to the biasing terminal 79 through emitter resistors 81 and 82.

Transistor 77 is made responsive to certain binary signal input conditions at input terminals 59 and 60 to provide a surge of current to charge up the equivalent capacitor load 67 when the output transistor 64 is switched to its off condition. This is accomplished in FIG. 3 by operatively connecting the base of transistor 77 to the circuit point 62 through capacitor 84, with the base of transistor 77 additionally being connected through resistor 86 to the junction between resistors 81 and 82. The combination of capacitor 84 and resistors 86 and 82 forms a differentiator network for applying positive and negative signal spikes to transistor 77 when the voltage at circuit point 62 changes values due to changing input signals.

In operation, a situation will be considered wherein ONE signals are applied to input terminals 59 and 60. The output transistor 64 is on and therefore the voltage at output terminal means 66 and consequently the voltage across capacitor load 67 is in the order of 0.2 volt representing a ZERO signal. The base-emitter voltage drop of output transistor 64 in conjunction with the diode drops of diode 69 and 70 clamp circuit point 62 at approximately 1.8 volts. Base current of first transistor 72 flows through diodes 73 and 74 and forms the collector current of output transistor 64, the base current of which flows from the collector of transistor 72 through diodes 69 and 70. No current flows through input diodes 57 or 58 since they are reversed biased. ONE signals are being applied to input terminals 59 and 60 and output transistor 64 is providing a ZERO output signal. The connection of the base of transistor 77 to the junction between resistors 81 and 82 biases transistor 77 to an off condition. Suppose now the input signal to input terminal 60 switches to a ZERO. If the ZERO signal is being provided by an output transistor from a previous stage, the voltage at input terminal 60 will be approximately 0.2 volt and taking into account the voltage drop across diode 58, the voltage at circuit point 62 will be in the order of 0.8 volt which is not enough to hold the output transistor 64 in its on condition. Output transistor 64 then switches to its off condition representing a ONE output signal. Since output transistor 64 is off it has no collector current. It will be remembered that the collector current of transistor 64 was the base current of transistor 72 so consequently transistor 72 is off. The capacitor load 67 before the appearance of the ZERO output signal is charged up to a ZERO value and now must be charged up to a ONE value. With all ONE inputs the voltage at circuit point 62 was at a first predetermined level in the order of 1.8 volts. With the appearance of a ZERO signal the voltage at point 62 dropped to a second predetermined level in the order of 0.8 volt. This negative change in voltage is coupled through capacitor 84 to provide a negative going spike input signal to transistor 77 which turns on for the transient period in which the spike appears, to supply a relatively high surge of current to the output terminal means 66, thereby speedily charging up capacitor 67 to its ONE voltage value. The duration of the spike signal to transistor 77 depends on the RC time constant of capacitor 84 in conjunction with resistors 86 and 82. After a very short transient period transistor 77 no longer has a negative input signal and it will turn off so that for a steady state condition wherein a ZERO input signal is applied to an input terminal 60, all of the transistors are off and substantially no current flow is exhibited. Speed of operation was enhanced by the operation of the transistor 77 supplying a large surge of current for a very short transient period.

If the signal to input terminal 60 now switches back to a ONE, the voltage at point 62 will rise, tending to turn on transistors 72 and 64 so that a ZERO output signal is again provided. The turning on of transistor 64 provides a discharge path to ground of the previous charge provides a discharge path to ground of the previous charge, representing a ONE signal, built up on capacitor load 67. The voltage at circuit point 62 changes from 0.8 volt to approximately 1.8 volts representing a positive going change of 1 volt. This positive going change is coupled through capacitor 84 to the base of transistor 77 which still remains in an off condition since it needs a negative going signal on its base in order to conduct. The appearance of another ZERO input signal at input terminals 59 or 60 or both will again turn on transistor 77 for a transient period as previously described.

Figure 4:
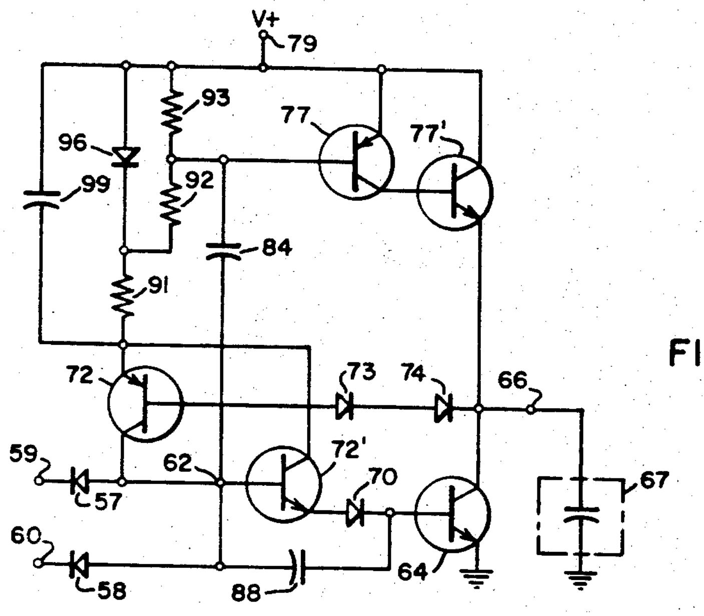

FIG. 4 illustrates a modification of the circuit of FIG. 3 and operates on the same principles as the circuit of FIG. 3 but has a combination and arrangement of components which makes the circuit ideally suited to be fabricated as an integrated circuit.

Several of the components in FIG. 4 have counterparts in FIG. 3 and they have been given smaller reference numerals. It is to be understood, however, that although the functions may be similar, the exact values or parameters may be different. In addition to the output transistor 64 and the first transistor 72, FIG. 4 includes a second transistor 72′ and other transistor means in the form of third transistor 77 and fourth transistor 77′. Transistor 77 in addition to an input electrode has an electrode connected to the input electrode of transistor 77′ and another electrode connected to a different electrode of transistor 77′. The remaining electrode of transistor 77′ is connected to the output terminal means 66. More specifically, transistors 77 and 77′ form a complementary pair, that is, a PNP and an NPN respectively with the emitter and collector of one connected to the collector and base of the other, respectively. This particular transistor arrangement may be fabricated in molecular form according to the teachings of Patent No. 3,197,710 issued July 27, 1965 and assigned to the assignee of the present application. Transistor 77′ amplifies the relatively lower current gain of transistor 77.

Transistors 72 and 72′ form a complementary PNP and NPN transistor pair having the identical connections as described with respect to transistors 77 and 77′. The base-emitter diode of transistor 72′ replaces diode 69 of FIG. 3. In order for the transistor pair 72–72′ and transistor 64 to turn on as a PNP switch, as in FIG. 3, the common base forward current gain of transistor 72 plus the common base forward current gain of transistor 72′ plus the common base forward current gain of transistor 64 must be equal to or greater than 1. Speed-up capacitor 88 connecting the base of transistor 64 with the circuit point 62 is added for reducing circuit response time. The emitter circuit of transistor 72 includes a plurality of resistors 91, 92 and 93 serially connected to biasing terminal 79. Diode 96 is in parallel with resistors 93 and 92 and functions as a voltage reference. More explicitly, resistors 92 and 93 form a voltage divider network with the voltage across these two resistors being in the order of 0.6 volt (the voltage drop across diode 96). The base of the PNP transistor 77 is operatively connected to the junction between resistors 92 and 93 and in the absence of a negative signal of proper magnitude, transistor 77 remains off. The transistor means including transistors 77 and 77' is made responsive to the switching of input signals by the connection of capacitor 84 to circuit point 62. Capacitor 99 connecting biasing terminal 79 with the emitter of first transistor 72 is provided in order to bypass any AC transients around emitter resistors 91, 92 and 93.

Basically, the operation of the circuit of FIG. 4 is the same as that of FIG. 3. The transistor means 77–77' is responsive to a certain voltage change at circuit point 62, due to predetermined combinations of input signals, to supply a large surge of current for a transient period during which the output transistor 64 turns off, in order to charge up the capacitor load 67 to its ONE value.

By way of example, the following table sets out typical values which may be used for the circuit of FIG. 4:

| | | |
|---|---|---|
| $V_+$ | volts | 4 |
| Resistor **91** | | 40K |
| Resistor **92** | | 160K |
| Resistor **93** | | 400K |
| Capacitor **84** | picofarads | 50 to 60 |
| Capacitor **88** | do | 10 to 60 |
| Capacitor **99** | do | 50 to 60 |

Input diodes 57 and 58 as well as diodes 70, 73 and 74 are silicon diodes. Complementary transistor pairs 72–72' and 77–77' are PNP/NPN structures made in accordance with the above-mentioned Patent No. 3,197,710, and transistor 64 may have characteristics of the 2N708 variety.

Operating parameters of the circuit of FIG. 4 can be varied by choosing different valued circuit components. Typical values, by way of example, and with a four volt power supply results in a 100 microwatt power dissipation operating on a 50% duty cycle with a gate turn on time of less than 20 nanoseconds and a turn off time of less than 30 nanoseconds. With output transistor 64 in an on condition maximum current flow in the circuit is approximately 49 microamps and with transistor 64 in an off condition maximum current is in the order of 1 microamp.

Accordingly, there has been provided logic gates which operate at increased switching speeds with relatively low power dissipation. This is accomplished by the provision of transistor means which supplies a large surge of current to the gate output terminal means only during a short transient period, in response to a certain change in combination of binary signals applied to the gate. The transistor means which supplies this large surge of current is of an opposite conductivity type than that of the output transistor of the gate.

Although the present invention has been described with a certain degree of particularity, it should be understood that the present disclosure has been made by way of example and that modifications and variations are made possible in the light of the above teachings.

What is claimed is:

1. A logic circuit comprising:

(A) a circuit point;

(B) input means connected to said circuit point for simultaneously receiving a plurality of binary input signals;

(C) output transistor means of one conductivity type and including a base, emitter and collector electrode and operable in an on and off condition depending upon the combination of said binary input signals;

(D) output terminal means connected to said output transistor means for providing an output signal;

(E) first transistor means of conductivity type opposite said output transistor and connected to said output transistor means for providing said output transistor with base and collector current;

(F) second transistor means responsive to a predetermined change in voltage level at said circuit point, as opposed to the level after it changes, for providing a surge of current to said output terminal means when said output transistor means switches from an on to an off condition.

2. A logic circuit comprising:

(A) a circuit point;

(B) input means connected to said circuit point for simultaneously receiving a plurality of binary input signals;

(C) an output transistor of one conductivity type and having a first, second and input electrode;

(D) a first transistor of conductivity type opposite said output transistor and having a first, second and input electrode with said second electrode being connected to said circuit point;

(E) means connecting said circuit point with the input electrode of said output transistor;

(F) means for providing the input electrode current of said first transistor to the second electrode of said output transistor;

(G) output terminal means connected to said second electrode of said output transistor;

(H) a second transistor of a conductivity type opposite to that of said output transistor and having a first, second and input electrode, with said second electrode being connected to said output terminal means; and (I) means connecting the input electrode of said second transistor to said circuit point for turning said second transistor on during a transient period when the voltage at said circuit point changes only from a first to a second value due to said input signals changing.

3. A logic circuit comprising:

(A) a circuit point;

(B) input means connected to said circuit point for simultaneously receiving a plurality of binary input signals;

(C) an output transistor of one conductivity type for turning on in response to said input signals all attaining the same predetermined binary value, and for turning off in response to at least one of said input signals attaining a value different than the other signals and having a first, second and input electrode;

(D) a first transistor of conductivity type opposite said output transistor and having a first, second and input electrode;

(E) means connecting the input and second electrodes of said first transistor to the second and input electrodes, respectively, of said output transistor;

(F) output terminal means for providing binary output signals in response to the turning on and off of said output transistor;

(G) other transistor means connected to said output terminal means and responsive to a change in voltage at said circuit point, due to a predetermined switching of input signals applied to said input means, to turn on and supply a surge of current only during the transient period in which said change in voltage takes place.

4. A logic circuit comprising:

(A) a circuit point;

(B) input means connected to said circuit point for receiving binary input signals;

(C) an output transistor having a first, second and input electrode;

(D) a first transistor having a first, second and input electrode;
(E) means connecting the input and second electrodes of said first transistor to the second and input electrode, respectively, of said output transistor, said output and first transistors being operable to turn on and off in response to the voltage level at said circuit point;
(F) other transistor means including a pair of complementary transistors each having a first, second and input electrode with
    (1) the first and second electrodes of one of said pair being connected to the second and input electrodes, respectively, of the other of said pair;
    (2) the first electrode of the other of said pair being connected to the second electrode of said output transistor;
(G) a biasing terminal for connection to a source of operating potential;
(H) means connecting the first electrode of said first transistor and the commonly connected electrodes of said pair of complementary transistors to said biasing terminal;
(I) circuit means connecting the input electrode of the first transistor of said pair of complementary transistors to said circuit point for turning on said transistor pair for a transient period during which the voltage level at said circuit point is changing due to a predetermined change of input signals;
(J) output terminal means connected to said output transistor for providing binary output signals.

5. A logic circuit comprising:
(A) a circuit point;
(B) a plurality of input diodes for receiving input binary signals, each said diode having a like electrode connected to said circuit point;
(C) an output transistor of a first conductivity type and including a base, emitter and collector electrode;
(D) a first transistor of a second conductivity type and including a base, emitter and collector electrode;
(E) first diode means connecting the base electrode of said output transistor to said circuit point;
(F) second diode means connecting the base electrode of said first transistor with the collector electrode of said output transistor;
(G) the collector electrode of said first transistor being connected to said circuit point;
(H) output terminal means connected to the collector electrode of said output transistor;
(I) a biasing terminal for connection to a source of operating potential;
(J) resistance means connecting the emitter electrode of said first transistor to said biasing terminal;
(K) a second transistor of a conductivity type opposite to that of said output transistor, and including a base, emitter and collector electrode and having its emitter electrode connected to said biasing terminal and its collector electrode connected to the collector electrode of said output transistor;

(L) a capacitor connecting said circuit point with the base electrode of said second transistor; and
(M) the base of said second transistor being connected to said resistance means, the combination of said capacitor and said resistance means forming a differentiator network.

6. A logic circuit comprising:
(A) a circuit point;
(B) a plurality of input diodes for receiving input binary signals, each said diode having a like electrode connected to said circuit point;
(C) an output transistor of a first conductivity type and including a base, emitter and collector electrode;
(D) a first transistor of a second conductivity type and including a base, emitter and collector electrode;
(E) a second transistor of a first conductivity type and including a base, emitter and collector electrode;
(F) the emitter and the collector of said first transistor being connected to the collector and base electrodes respectively of said second transistor;
(G) diode means connecting the base of said first transistor to the collector of said output transistor;
(H) diode means connecting the emitter of said second transistor to the base of said output transistor;
(I) a biasing terminal for connection to a source of operating potential;
(J) resistance means connecting the emitter electrode of said first transistor to said biasing terminal;
(K) a third transistor of a second conductivity type and including a base, emitter and collector electrode;
(L) a fourth transistor of a first conductivity type and including a base, emitter, and collector electrode;
(M) the emitter and collector electrodes of said third transistor being connected to the collector and base electrodes respectively of said fourth transistor;
(N) the emitter and collector electrodes of said third and fourth transistors being connected to said biasing terminal;
(O) the emitter electrode of said fourth transistor being connected to the collector electrode of said output transistor;
(P) capacitor means connecting the base electrode of said third transistor with said circuit point;
(Q) the base electrode of said third transistor being additionally connected to said resistance means; and
(R) output terminal means connected to the junction between the emitter of said third and the collector of said output transistor.

References Cited

UNITED STATES PATENTS

| | | | |
|---|---|---|---|
| 3,050,641 | 8/1962 | Walsh | 307—88.5 |
| 3,183,366 | 5/1965 | Brode | 307—88.5 |
| 3,358,154 | 12/1967 | Hung | 307—88.5 |

ARTHUR GAUSS, *Primary Examiner.*

BERNARD P. DAVIS, *Assistant Examiner.*

U.S. Cl. X.R.

307—218, 246, 305, 313